United States Patent
Hall et al.

(10) Patent No.: US 7,520,444 B1
(45) Date of Patent: Apr. 21, 2009

(54) SYSTEM AND METHOD FOR CONTROLLING HEAT EXCHANGER FANS

(75) Inventors: Curtis W. Hall, Conyers, GA (US); Heyward E. Menasco, Jr., Hoover, AL (US)

(73) Assignee: AT&T Intellectual Property I, L.P., Reno, NV (US)

( * ) Notice: Subject to any disclaimer, the term of this patent is extended or adjusted under 35 U.S.C. 154(b) by 1078 days.

(21) Appl. No.: 10/107,775

(22) Filed: Mar. 28, 2002

Related U.S. Application Data

(60) Provisional application No. 60/348,121, filed on Jan. 15, 2002.

(51) Int. Cl.
*F24F 7/00* (2006.01)
*F25D 17/00* (2006.01)

(52) U.S. Cl. .................... 236/49.3; 62/179

(58) Field of Classification Search ............. 236/49.3; 62/178, 179, 186, 259.2; 165/244, 247
See application file for complete search history.

(56) References Cited

U.S. PATENT DOCUMENTS

| | | | |
|---|---|---|---|
| 4,716,409 A * | 12/1987 | Hart et al. ............ | 340/825.22 |
| 6,286,326 B1 * | 9/2001 | Kopko .................. | 62/179 |
| 6,928,559 B1 * | 8/2005 | Beard .................. | 713/300 |
| 2003/0067722 A1 * | 4/2003 | Vitek .................. | 361/24 |

* cited by examiner

*Primary Examiner*—Marc E Norman
(74) *Attorney, Agent, or Firm*—Withers & Keys, LLC

(57) ABSTRACT

A fan controller reduces the percentage of time that fans used in a heat exchanger of an outdoor cabinet that houses electronics and power source must operate to provide required cooling to the electronics and power source. The fan controller can also reverse operation of a fan of the heat controller to help reduce clogging of air intakes as well as to clean the interior of the cabinet. In an embodiment, the controller operates the fans in the heat exchanger according to operating temperature ranges. Thermostats can be used to provide the operating temperature ranges. Depending on the state of the thermostats and the ambient temperature, the fan controller causes one fan to operate in the reverse direction while the other fan is idle, causes one fan to operate in the forward direction while the other fan is idle, or causes both fans to operate in the forward direction.

4 Claims, 10 Drawing Sheets

SYSTEM AND METHOD FOR CONTROLLING HEAT EXCHANGER FANS

This application claims the benefit of U.S. Provisional Application No. 60/348,121, filed Jan. 15, 2002, which is herein incorporated by reference in its entirety.

BACKGROUND

1. Field of the Invention

The present invention relates generally to cooling systems for battery and electronic component enclosures. More specifically, the present invention relates to a fan controller for a fan-based heat exchanger for use in outdoor cabinets that house electronic components such as telephone digital loop carrier equipment and data and video transport equipment.

2. Background of the Invention

Telephone companies typically deploy outdoor cabinets to house electronic telephone equipment such as ADSL multiplexors. The cabinets typically have two chambers. One chamber houses the electronics. The second chamber houses a power source such as a battery. An exemplary cabinet is the Lucent 52B cabinet.

The outdoor cabinets typically include a fan-based heat exchanger to provide cooling to the electronics and battery as well as to remove gases that may build up due to the operation of the battery. Typically, the heat exchanger is driven by fans located in the door or heat exchanger of the cabinet. The fans create airflow that draws air up through the door or heat exchanger of the cabinet to the outside. This airflow extracts heat from the internal chambers of the cabinet.

Operation of the fans is controlled by a fan controller. In a conventional heat exchanger, the fan controller causes the fans to be either entirely "on" or entirely "off." FIG. 1 is a schematic diagram of a prior art fan controller 100. Fan controller 100 controls a fan 102a and a fan 102b. A power source 104 provides power to operate fans 102a and 102b when a thermostat 106 is closed. Conventionally, thermostat 106 is set to operate at, for example, approximately 13 degrees Celsius. That is, when the ambient temperature within the cabinet or within the battery compartment is greater or equal to 13 degrees Celsius, thermostat 106 closes. Closure of thermostat 106 supplies power to fans 102a and 102b to operate them. Once operating, the fans usually do not shut off until the ambient temperature falls below, for example, approximately 10 degrees Celsius. Consequently, in summer months, the fans are likely to be on all the time. Even in other months, the fans are likely to be on almost 90 percent of the time.

One problem with conventional heat exchangers is that the two fans generally operate at least 90 percent of the time, even when maximum cooling is not required. This long, almost continuous, operation of the fans significantly reduces the expected lifetime of the fans. With large numbers of deployed cabinets, the requirement to send service personnel to replace failed fans is very expensive. The costs are not limited to the cost of the fans themselves, but also include the cost of the service personnel and fleets of vehicles to transport the service personnel.

Another problem associated with conventional cabinets is that air intakes (where the air is sucked in from the outside) are typically only about 4 inches off the ground. This poses no problem in the relatively clean environment of a manufacturer's testing lab. In the outdoor environment in which the cabinets are typically deployed, however, the low placement of the intakes tends to allow the fans to suck in material or debris such as grass clippings, seeds, dirt and dust into the interior of the cabinet. Because the fans operate for such long periods, a lot of material and debris can be sucked up through the intakes. This material and debris reduces the efficiency of the heat exchanger. The reduction in efficiency of the heat exchanger adversely affects the operation of the electronics and the battery as well as significantly reduces their operational lifetimes.

Another problem is due to a fine mesh screen that covers the air intakes. The mesh screen prevents rodents and insects from getting into to the cabinet. However, over a period of time, the screens often become clogged. The clogging obstructs airflow through the cabinet. This creates a vacuum effect in the interior chambers of the cabinet. As a result, when it rains, water can be sucked up into the cabinet through any crack or crevices in the exterior shell of the cabinet. The suction of the fans prevents the water from leaking out. The trapped water can have a corrosive effect on the electronics and battery inside the cabinet. This lowers the life expectancy of the battery and reduces the reliability of the electronics.

One method that has been tried to solve the foregoing problems was to reverse the direction of the fans, so that the fans blow air out of the cabinet. This solution had the intended effect of reducing clogging of the intake meshing. However, this solution also had the unintended effect of increasing the internal temperature of the cabinet to a point above a safe operating temperature for the battery or electronics. Consequently, this technique could not be used in most cases.

SUMMARY OF THE INVENTION

The present invention solves the forgoing problems with conventional heat exchanger fan controllers by providing a fan controller that reduces the duration for which fans comprising a heat exchange system are operating while still maintaining adequate cooling. Reducing the operating time in the manner indicated by the present invention provides multiple benefits. For example, the reduction in operating time increases the mechanical life of the fans since they are not operated as much as in conventional systems.

In addition, the present invention provides circuitry to reverse the operation of a fan for limited times to help reduce or eliminate clogging of the mesh that protects the intake for airflow to provide cooling to the cabinet. Reversing the fan allows the fan to blow air out of the cabinet to loosen and remove material that may have clogged the mesh during other operating times. Reversing the fan also tends to clean the cabinet enclosure. That is, any accumulated dirt and other debris that found its way into the cabinet through the protective mesh is likely to be blown out of the cabinet by the air being forced out of the cabinet due to the reverse operation of the fan.

In one embodiment, the present invention is a fan controller for controlling fans in a heat exchanger, wherein a first fan has power supplied by a DC power source and a second fan has power supplied by the DC power source. The fan controller has a first thermostat coupling the first fan to the DC power source. The first thermostat has a first operating temperature range that is defined by a lower temperature bound and an upper temperature bound. The first thermostat causes the first fan to operate in a forward direction if the ambient temperature is above the upper bound of the first operating temperature range.

The fan controller of this embodiment also includes a second thermostat that can couple the second fan to the DC power source. The second thermostat has a second operating temperature range that is defined by a lower temperature bound and an upper temperature bound, wherein the second thermostat causes the second fan to operate in a forward direction if an ambient temperature is above the upper bound of the second operating temperature range.

Further, the fan controller of this embodiment includes a switch that has two states. When the switch is in the first state, the second fan operates in the reverse direction. When the switch is in the second state, the second fan can operate in the forward direction.

In another embodiment, the present invention is a cabinet for housing electronics and a battery. The cabinet includes a first fan coupled to a power source that operates in a forward direction when an ambient temperature exceeds a first threshold value. The first fan shuts off when the ambient temperature falls below a second threshold value. This embodiment of the present invention also includes a second fan coupled to the DC power source. The second fan operates in a forward direction when the ambient temperature exceeds a third threshold value, and shuts off when the ambient temperature falls below a fourth threshold value. Further, the second fan operates in a reverse direction if the ambient temperature is below the second threshold value and continues to operate in the reverse direction until the temperature rises above the first threshold value.

In another embodiment, the present invention is a method for controlling a first fan and a second fan in a heat exchanger. According to the method, an ambient temperature is determined. The method continues with the step of operating the second fan in a reverse direction if the ambient temperature is less than a predetermined first threshold temperature or if the ambient temperature exceeds the first threshold, but falls below a second threshold. In addition, the method continues with the step of operating a first fan in a forward direction if the ambient temperature is greater than the predetermined first threshold temperature. The method continues with the step of operating the first fan and the second fan in a forward direction if the ambient temperature is greater than a predetermined third threshold temperature. Further, the method continues with the step of operating the first fan in the forward direction and shutting off the second fan if the ambient temperature falls below a fourth threshold.

In another embodiment, the present invention is a system for controlling a first fan and a second fan in a heat exchanger for a cabinet enclosing electronic telephone equipment and an associated power source. The system includes means for selecting a first operating temperature range for a first thermostat, the first operating temperature range being defined by a first lower temperature bound and a first upper temperature bound and means for selecting a second operating temperature range for a second thermostat, the second operating temperature range being defined by a second lower temperature bound and a second upper temperature bound. Further, the system includes means for operating the second fan in a reverse direction if an ambient temperature is less than the first upper temperature bound. The system also includes means for operating the first fan in a forward direction if the ambient temperature exceeds the first upper temperature bound and means for operating the first and second fans in the forward direction if the ambient temperature exceeds the second upper temperature bound.

DETAILED DESCRIPTION OF THE INVENTION

Figure 1:
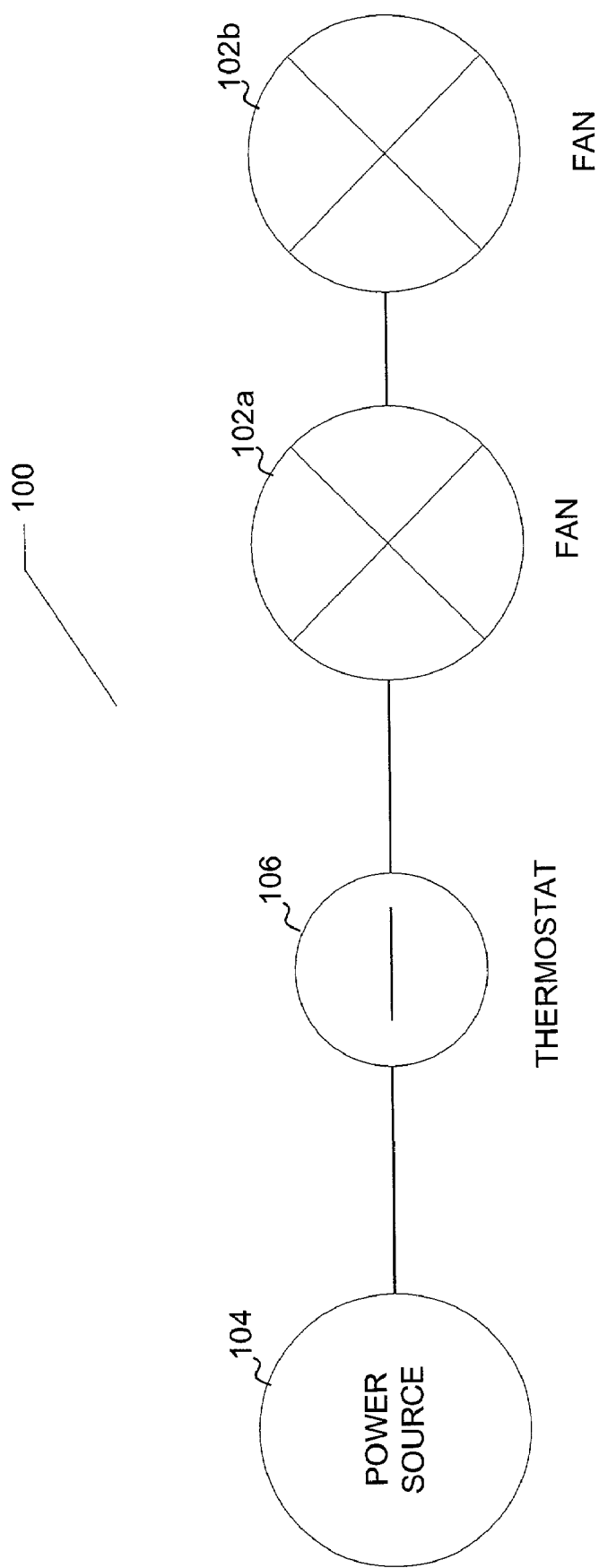
FIG. 1 is a schematic diagram of a prior art fan controller used to control the fans of a heat exchange system.
Figure 2:
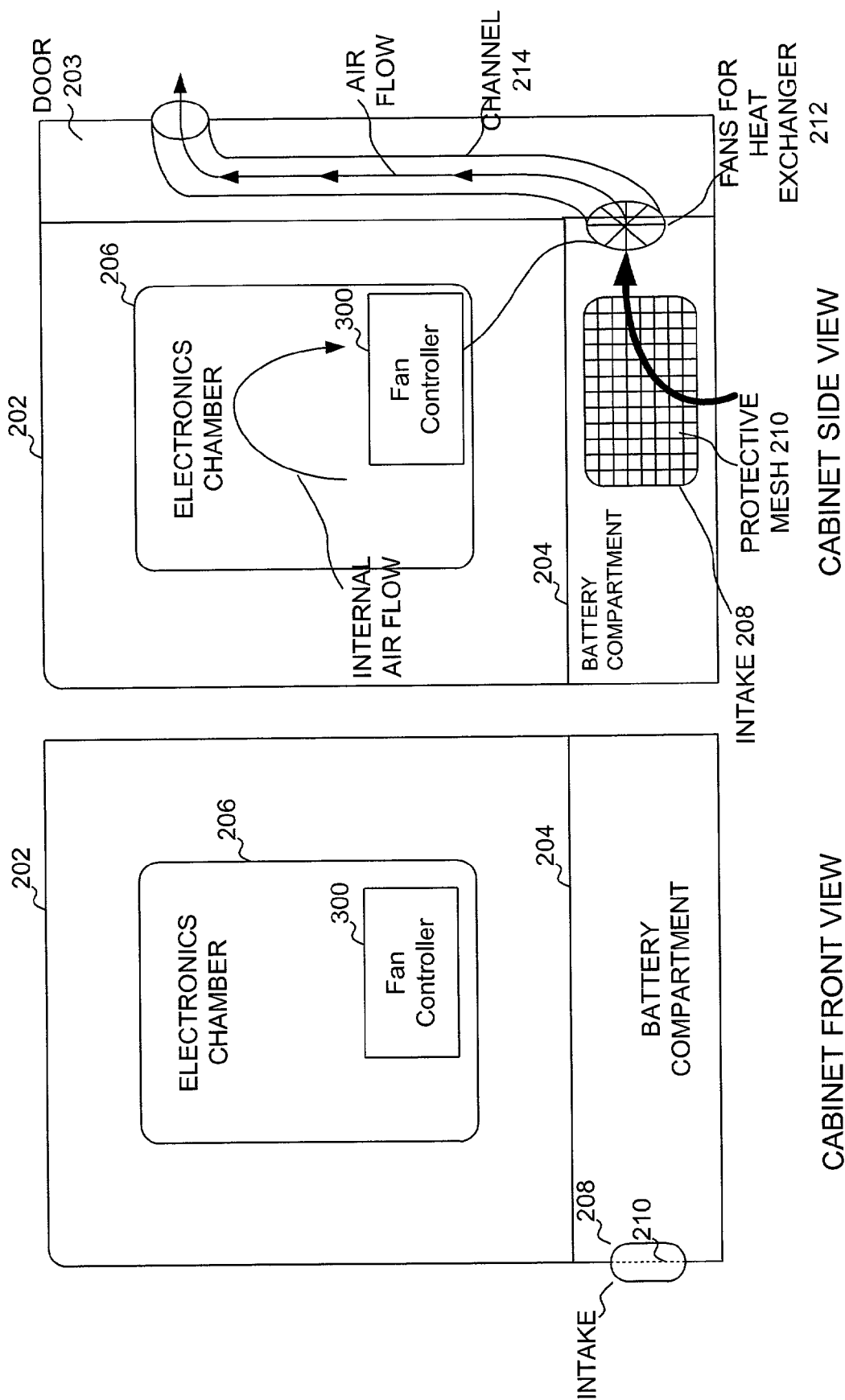
FIG. 2A is a schematic diagram of a side view of an exemplary cabinet for housing a battery and electronic components.
FIG. 2B is a schematic diagram of a front view of an exemplary cabinet for housing a battery and electronic components.

FIG. 2A is a schematic diagram of a front view of a cabinet 202 that can be used to house a electronic components and power supply. A battery compartment 204 houses a power supply such as a battery. The electronic components are located in an electronics chamber 206 of the cabinet. An intake 208 allows airflow through the cabinet to provide cooling for the battery and electronic equipment located in an electronics chamber. Intake 208 is also referred to as a vent or an air intake herein. Generally, intake 208 is located about 4 inches from the bottom of cabinet 202. A protective mesh 210 covers the vent primarily to prevent rodents and other small animals from crawling into the cabinet.

FIG. 2B is a schematic diagram of a side view of a cabinet that can be used to house electronics for telephone lines. As can be seen, cabinet 202 has an access door 203. Access door 203 allows service personnel to access the interior of cabinet 202 to maintain electronics, replace the battery and perform other service operations.

Airflow is created by heat exchanger fans 212. Another fan (not shown) is used to create airflow in the electronics chamber. Airflow created by fans 212 cools the electronics and battery chambers and expels gases released from the battery from the battery chamber. Air flows through a channel 214 in the directions shown in FIG. 2B to carry heat out of the interior of cabinet 202. In addition, the airflow serves to expel battery gases that may build up due to operation of the battery. Channel 214 can be a duct in access door 203, a tube or any other channel through which air can flow from battery compartment 204 through the heat exchanger.

Figure 3:
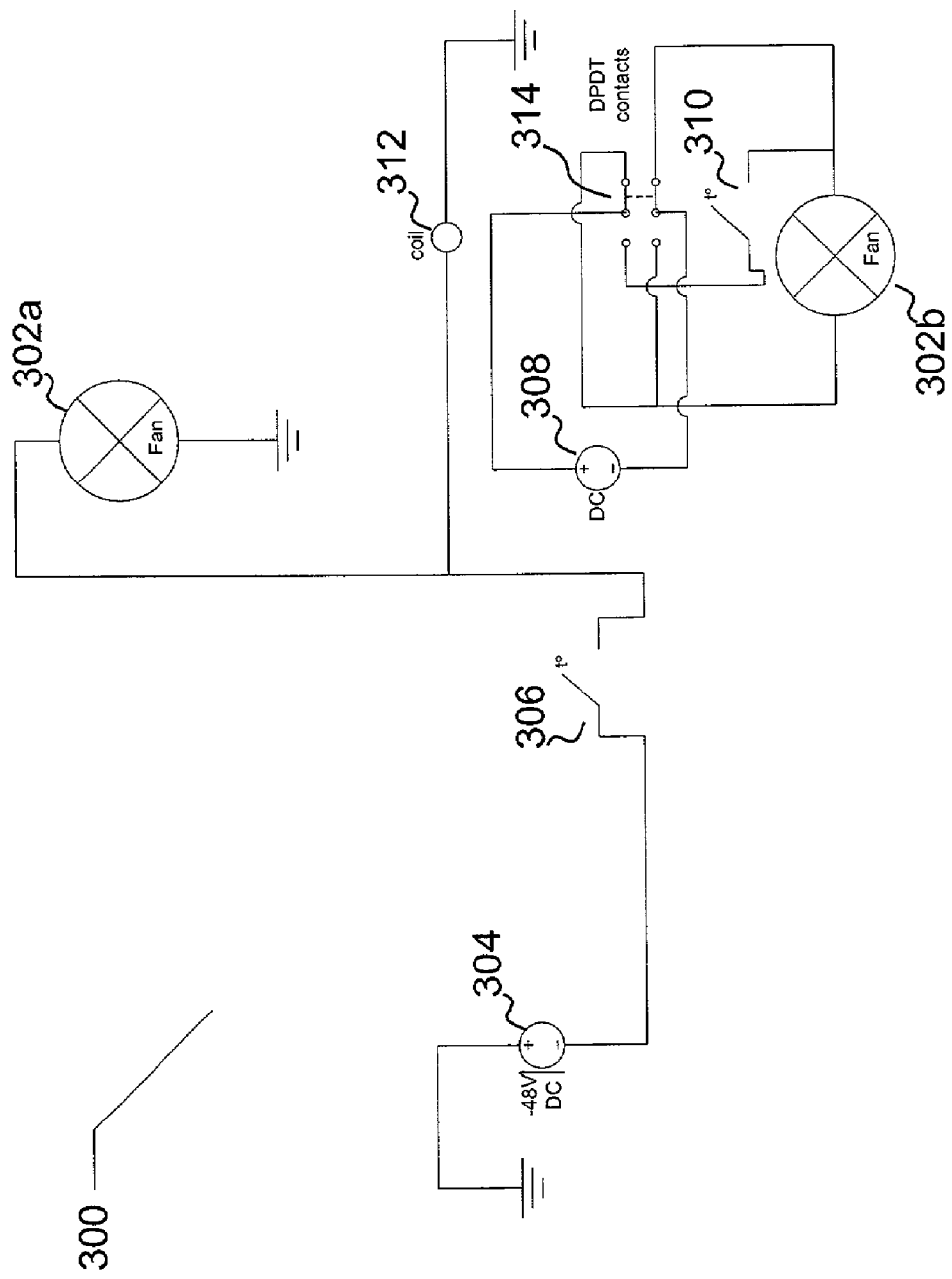
FIG. 3 is a schematic diagram of a fan controller according to an embodiment of the present invention.

To create airflow, heat exchanger fans 212 are controlled by a fan controller. FIG. 3 is a schematic diagram of a fan controller 300 for controlling fans 212 according to an embodiment of the present invention. Fans 212 are represented by fan 302a and 302b in FIG. 3. Fan controller 300 is a controller for operating a first fan 302a and a second fan 302b. For example, the present invention can be used to control fans 212 of cabinet 202. Although the present invention is described in terms of two fans, the fan controller described herein, can be extended to systems having three, four or more fans.

A DC power source 304 provides power to fan 302a through a thermostat 306. Thermostat 306 acts as a switch that closes at a temperature $T_1$ and opens at a temperature $T_2$. A DC power source 308 provides power to fan 302b through a thermostat 310. Preferably, DC power source 304 and 308 are the same DC power source. However, in general, DC power source 308 can be a different power source from DC power source 304. Thermostat 310 acts as a switch that closes at temperature $T_3$ and opens at $T_4$. A coil 312 operates as a relay that causes a double pole double throw (DPDT) switch to change state, i.e., flip, when current is applied to coil 312.

Thermostat 306 is preferably located in battery compartment 204. Thermostat 310 is preferably located in electronics chamber 206. Thermostats 306 and 310 can also both be located in either battery compartment 204, electronics chamber 206 or anywhere else in the cabinet so long as appropriate temperature ranges are chosen for their operation. The appropriate temperature range to choose will depend on cooling requirements for the particular environment in which the thermostats are used.

The temperature range for thermostats 306 and 310 must be chosen to avoid any overlap of the ranges. Thus, the temperature range for thermostat 306 (from $T_2$ to $T_1$) must be chosen so that it does not overlap with the temperature range for thermostat 310 (from $T_4$ to $T_3$). For example, in an embodiment of the present invention a suitable temperature range for thermostat 306 is 20° C. to 30° C., and a suitable temperature range for thermostat 310 is 40° C. to 60° C. Other temperature ranges may be chosen depending upon specific implementations requirements.

TABLE I

| Temperature | Position Thermostat 306 | FAN 1 | Position Thermostat 310 | RELAY | FAN 2 |
| --- | --- | --- | --- | --- | --- |
| <20° C. | OPEN | OFF | OPEN | OFF | REV |
| >30° C. | CLOSED | ON | OPEN | ON | OFF |
| >50° C. | CLOSED | ON | CLOSED | ON | ON |
| <45° C. | CLOSED | ON | OPEN | ON | OFF |

Table I provides exemplary operating parameters for an exemplary embodiment of the present invention. In the embodiment illustrated in Table I, $T_1$=30° C., $T_2$=20° C., and $T_3$=50° C. and $T_4$=45° C. The operation of the present invention will be described with respect to these exemplary parameters. It should be noted that the exemplary parameters are for purposes of explanation. The invention is not limited to use of these values for the parameters. Other values for each of the parameters can be used for different implementations of the present invention.

When the ambient temperature T is below 20° C., both thermostat 306 and thermostat 310 are open. Therefore, no power is provided to fan 302a. Consequently, fan 302a is off. This operation reflects that there is no cooling required for relatively low ambient temperatures.

In addition, because no current flows through the coil to the relay, the relay is OFF, i.e., the double pole double throw (DPDT) switch remains in its current state. As shown in FIG. 3, fan 302b is connected to the second power source in opposite polarity. Consequently, fan 302b operates in the reverse direction. Thus, fan 302b blows air out of battery compartment 204, rather than sucking air into battery compartment 204. Thus, when neither fan is required for cooling, fan 302b is operated in reverse to blow air out of the cabinet. This action helps to clean battery compartment 204 by blowing dust and other material that passed through the protective mesh out of the cabinet. In addition, blowing air out of the cabinet through air intake vents 208 and protective mesh 210 reduces and eliminates the accumulation of debris on air intake vents 208 and protective mesh 210. The operational aspects of fan controller 300 shown in FIG. 3 for this operation are illustrated in FIG. 4.

Figure 4:
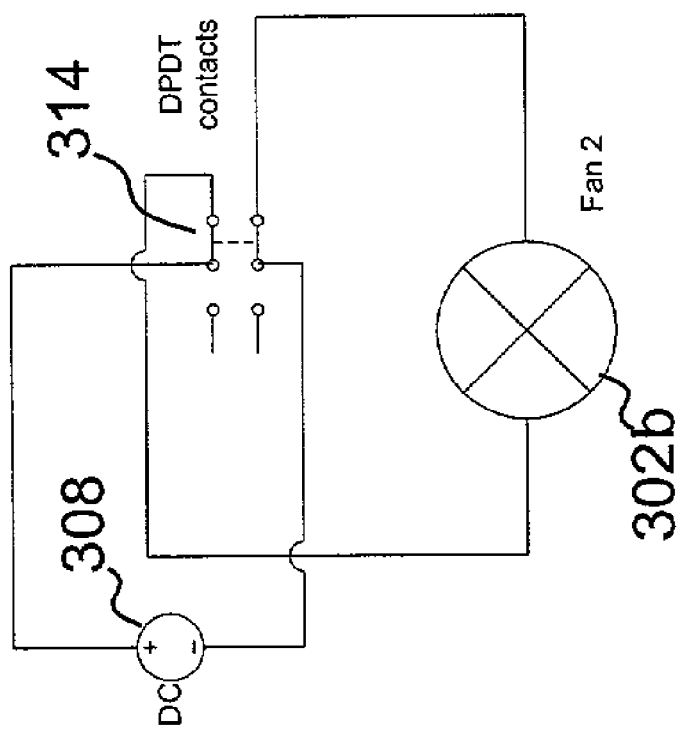
FIG. 4 is a schematic diagram of a fan controller with a fan operating in the reverse direction according to an embodiment of the present invention.

As shown in FIG. 4, fan 302b is connected to power source 308 such that it operates in its reverse direction. Preferably, DPDT switch 314 is initialized to this state. DPDT switch 314 switches only when current flows through coil 312.

Returning to FIG. 3, when the ambient temperature rises to 30° C. or above, thermostat 306 closes. Closure of thermostat 306 thereby provides power to fan 302a to cause fan 302a to operate to begin cooling. In addition, current is applied to coil 312, which causes DPDT switch 314 to switch to its other state. However, thermostat 310 is still open because its threshold temperature of 50° C. ($T_3$) has not been reached. Consequently, no power is delivered to fan 302b. Thus, fan 302b shuts off. Consequently, only fan 302a is operating. In this state, only an intermediate amount of cooling is provided since only one of the two cooling fans is operating. This helps extend the mechanical life of fan 302b. The operational aspects of fan controller 300 shown in FIG. 3 for this operation are illustrated in FIG. 5.

Figure 5:
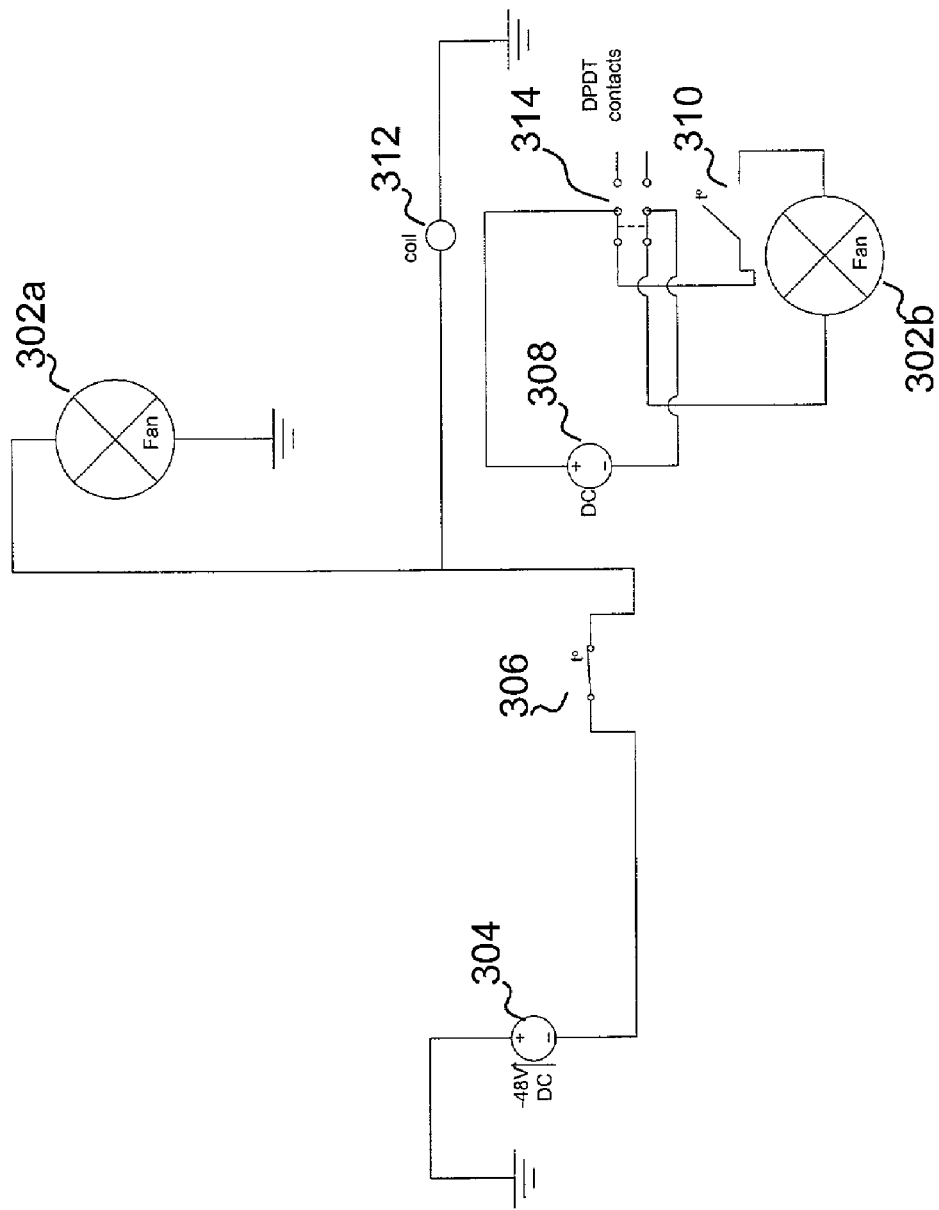
FIG. 5 is a schematic diagram of a fan controller with a fan operating in the forward direction according to an embodiment of the present invention.

In FIG. 5, closure of thermostat 306 causes current to flow through coil 312. Current flowing through coil 312 causes DPDT switch 314 to change state by its relay action. However, no power is delivered to fan 302b because thermostat 310 is still open because its threshold temperature of 50° C. ($T_3$) has not been reached. Consequently, only fan 302a is operating for cooling at this point.

Returning to FIG. 3, when the ambient temperature rises to 50° C. or above, thermostat 310 closes. Closure of thermostat 310 thereby provides power to fan 302b to cause fan 302b to operate in the forward direction to begin cooling. Fan 302b operates in the forward direction because the state of switch 314 causes DC power source 308 to be connected to fan 302b in forward polarity. At this point both fan 302a and fan 302b are in operation, and maximum cooling is provided. The operational aspects of fan controller 300 shown in FIG. 3 for this operation are illustrated in FIG. 6.

Figure 6:
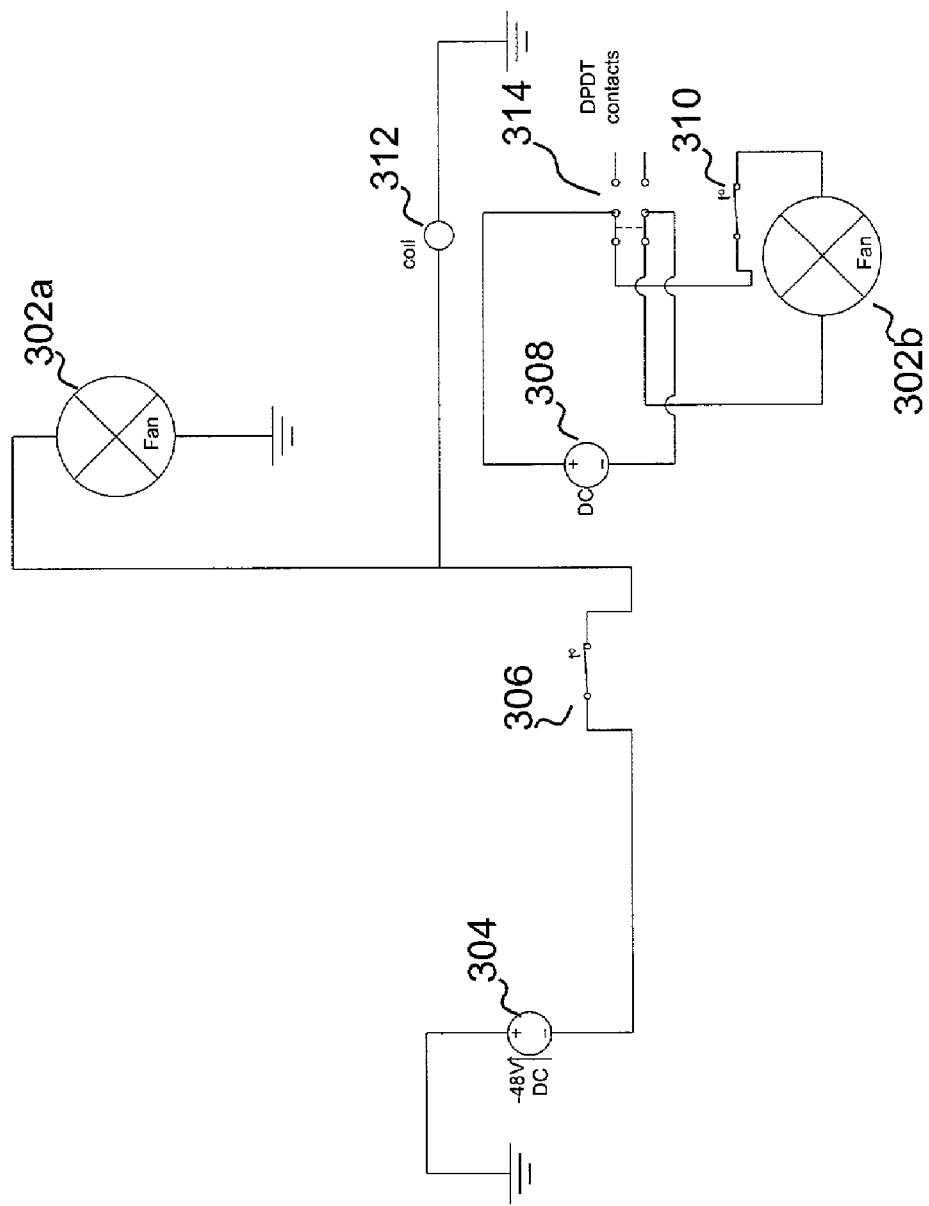
FIG. 6 is a schematic diagram of a fan controller with two fans operating in the forward direction according to an embodiment of the present invention.

As shown in FIG. 6, with thermostat 310 closed, fan 302b is connected to power supply 308 in the forward direction. The forward direction is the normal direction of rotation for the fan. Thus, fan 302b operates in conjunction with fan 302a to provide maximum cooling.

Returning to FIG. 3, when the ambient temperature drops to 45° C. or below, thermostat 310 opens, thereby removing power to fan 302b. Thus, fan 302b shuts off. Consequently, only fan 302a is operating. The operational aspects of fan controller 300 shown in FIG. 3 for this operation are illustrated in FIG. 5 as described above.

When the ambient temperature drops to 20° C. or below, thermostat 306 opens, thereby removing power to fan 302a. Thus, fan 302a shuts off. In addition, no current flows through the coil that controls the relay. As a result the DPDT switch flips back to its original position. This causes fan 302b to operate in the reverse direction. The operational aspects of fan controller 300 shown in FIG. 3 for this operation are illustrated more clearly in FIG. 4 as described above.

Thermostat 306 can be set to open and close at that same temperature. Likewise, thermostat 310 can be set to open and close at the same temperature. That is, if the temperature rises above the thermostat set point, the thermostat closes. Similarly, if the temperature falls below the temperature set point, the thermostat opens. Setting the thermostats to operate in this manner is generally not preferred because it can result in oscillation of the thermostat as the temperature passes through the set point.

The foregoing description used particular temperatures for $T_1$, $T_2$, $T_3$ and $T_4$. It should be noted that any temperature ranges using these parameters can be defined for the thermostats described above provided that the temperature range from $T_2$ to $T_1$ does not overlap the temperature range from $T_4$ to $T_3$.

The fan controller described above can also be implemented using discrete digital elements as well as a combination of discrete digital and analog components. Alternatively, the fan controller can be programmed to be carried out by a digital computer programmed to perform the steps of the method. Programming techniques to implement the steps of the method would be known to those having skill in the art.

Figure 7:
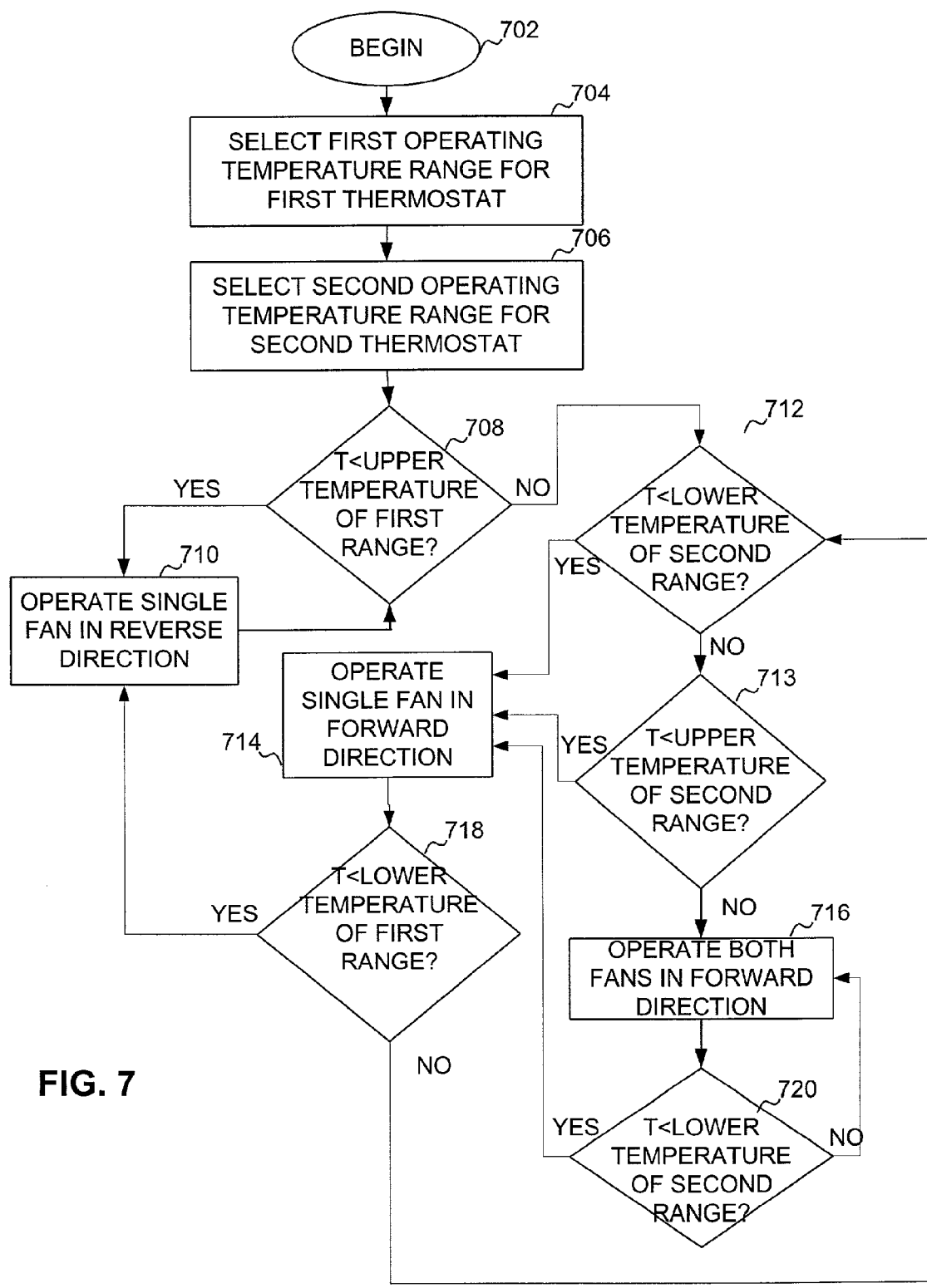
FIG. 7 is a flow chart for a method for controlling fans of a heat exchanger according to an embodiment of the present invention.

A method for controlling fans in a heat exchanger is illustrated in the flow chart of FIG. 7. Preferably, the method is carried out by a controller comprising discrete analog and/or digital components, such as the controller described above in FIGS. 3-6. Alternatively, the method can be carried out by a digital computer programmed to perform the steps of the method. Programming techniques to implement the steps of the method would be known to those having skill in the art.

The method begins in step 702. In step 704, a first operating temperature range having a lower temperature bound and an upper temperature bound is selected. Preferably, the first temperature range corresponds to the operating temperature range of a first thermostat. Where the temperature range corresponds to the operating temperature range of a thermostat, for example, the upper temperature is the temperature above which the thermostat will close to allow current flow, and the lower temperature is the temperature below which the thermostat will open to prevent current flow. Preferably, the upper and lower temperatures are chosen so that the method will provide a safe temperature environment for the battery and electronics to operate. The temperature bounds are alternately referred to herein as temperature thresholds.

In step 706, a second operating temperature range having a lower temperature bound and an upper temperature bound is selected. Preferably, the second temperature range corresponds to the operating temperature range of a second thermostat. Where the temperature range corresponds to the operating temperature range of a thermostat, for example, the upper temperature is the temperature above which the thermostat will close to allow current flow, and the lower temperature is the temperature below which the thermostat will open to prevent current flow. Preferably, the upper and lower temperatures are chosen so that the method will provide a safe temperature environment for the battery and electronics to operate. The temperature bounds are alternately referred to herein as temperature thresholds.

In step 708, the method determines whether the ambient temperature is lower that the upper temperature bound of the first temperature range. If it is, the method continues in step 710 with the step of operating a single fan in the reverse direction. This has the effect of cleaning the interior of the cabinet as described above. If the ambient temperature is not below the upper temperature bound of the first temperature range, the method continues in step 712 by determining whether the ambient temperature is below the lower temperature bound of the second temperature range. If it is, the method continues in step 714 with the step of operating a single fan in the forward direction (i.e., its normal operating direction). Only one fan is required due to the moderate value of the ambient temperature.

The method then continues in step 718 with the step of determining whether the ambient temperature has fallen below the lower temperature bound of the first temperature range. If it has, the method continues in step 710 with the step of operating a single fan in the reverse direction. Preferably, at this point the fan that was idle is used to prevent wear and tear by reversing an operating fan. If the ambient temperature has not fallen below the lower bound of the first temperature range, the method continues in step 712 with the step of determining whether the ambient temperature is below the lower temperature bound of the second temperature range.

If the ambient temperature is below the lower temperature bound of the second temperature range as determined in step 712, the method continues in step 714 with the step of operating a single fan in the forward direction. Preferably, the fan that operates is not the fan that was operating in the reverse direction. Thus, preferably, the fan that was operating in the reverse direction is shut off if it was operating in the reverse direction, and the other fan is operated in the forward direction. This helps to extend the operational life of the fans.

If the ambient temperature, as determined in step 712, is not below the lower temperature bound of the second temperature range, the method continues in step 713 with the step of determining whether the ambient temperature is below the upper temperature bound of the second temperature range. If the ambient temperature is below the upper bound of the second temperature range, the method continues in step 714 with the step of operating a single fan in the forward direction. Preferably, the fan that operates is not the fan that was operating in the reverse direction. Thus, preferably, the fan that was operating in the reverse direction is shut off if it was operating in the reverse direction, and the other fan is operated in the forward direction. This helps to extend the operational life of the fans.

If the ambient temperature, as determined in step 713, is not below the upper temperature bound of the second temperature range, the method continues in step 716 with the step of operating the both fans in the forward direction. The method then continues in step 720 with the step of determining whether the ambient temperature is below the lower temperature bound of the second temperature range. If the ambient temperature is not below the lower temperature bound of the second temperature range, the method continues in step 716 with the step of operating both fans in the forward direction.

If the ambient temperature, as determined in step 720, is below the lower temperature bound of the second temperature range, the method continues in step 714 with the step of operating a single fan in the forward direction. This will required shutting off one of the fans. Preferably, the fan that is shut off is the fan that operates in the reverse direction. This helps to extend the operational life of the fans.

Figure 8A:
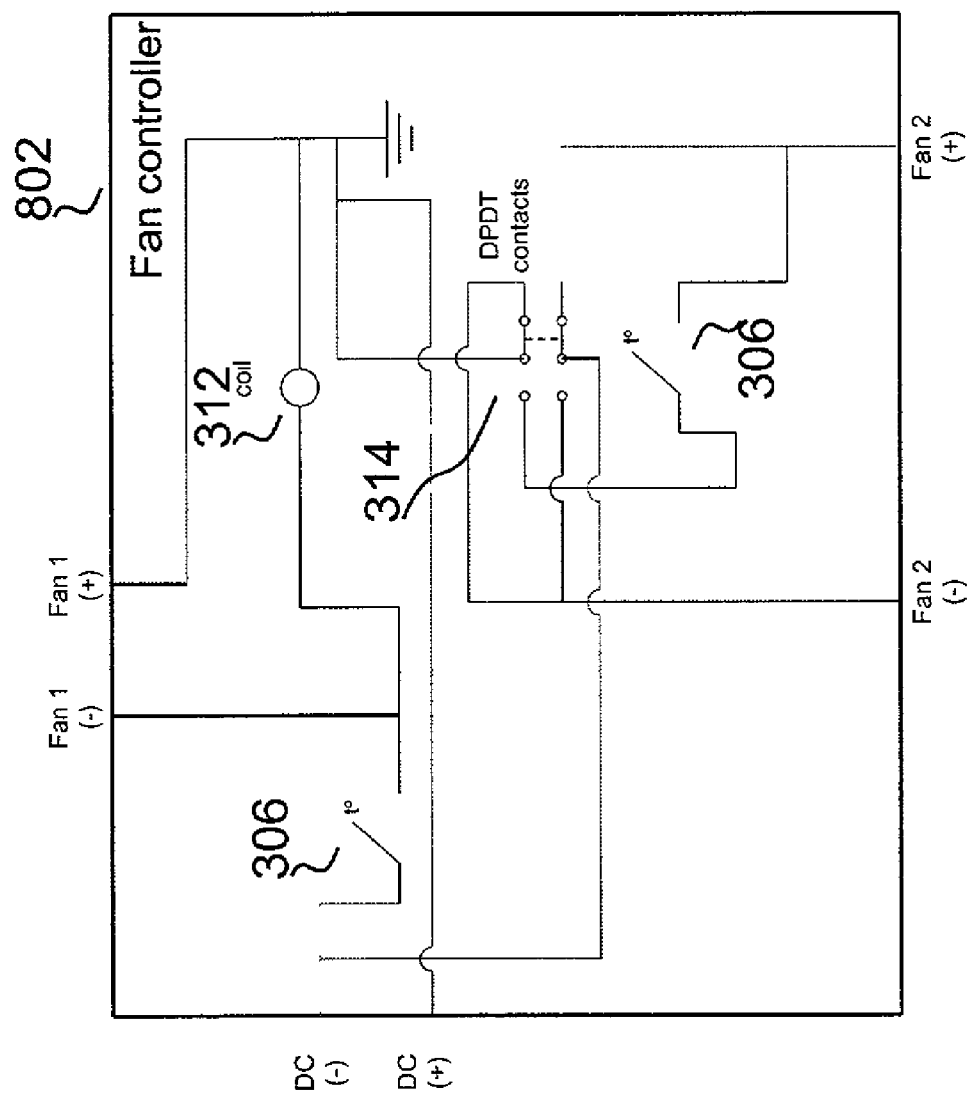
FIG. 8A is a schematic diagram of a fan controller in a first operating condition according to another embodiment of the present invention.
Figure 8B:
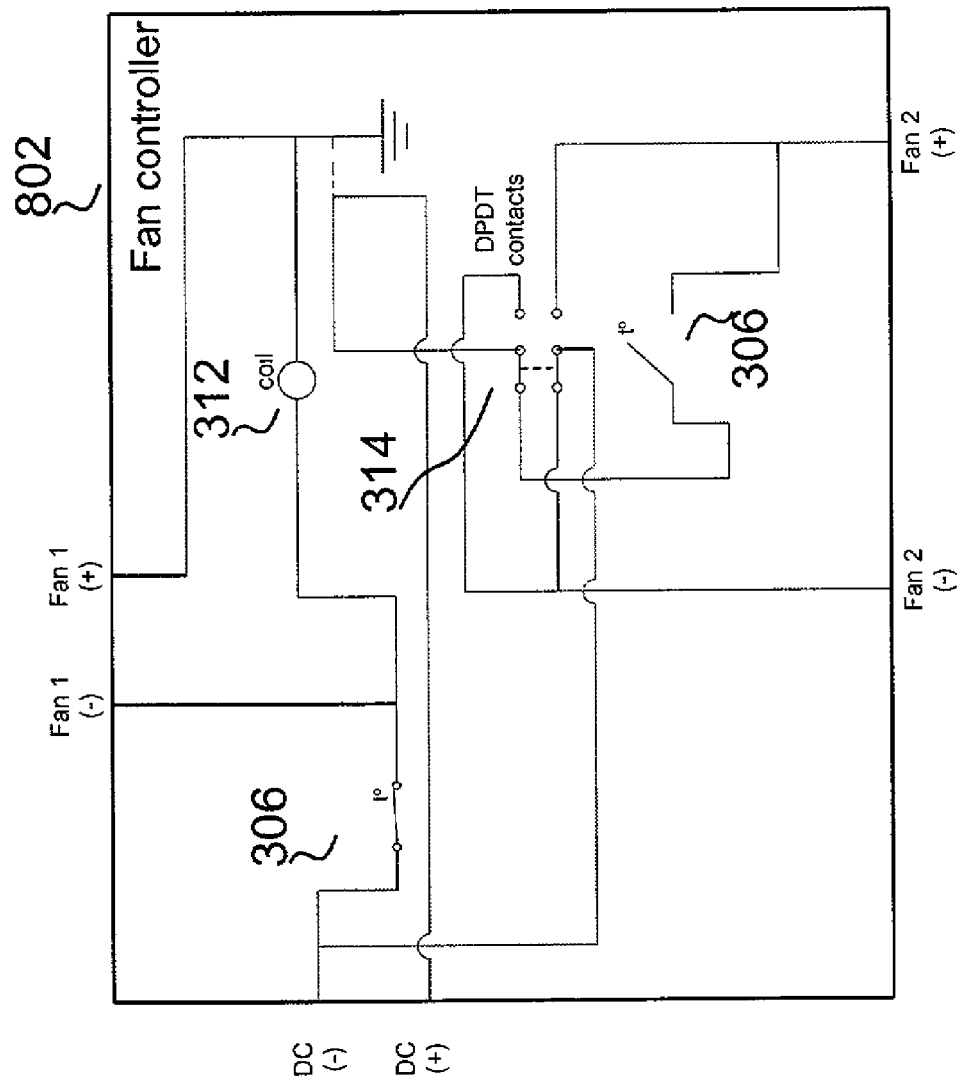
FIG. 8B is a schematic diagram of a fan controller in a second operating condition according to another embodiment of the present invention.
Figure 8C:
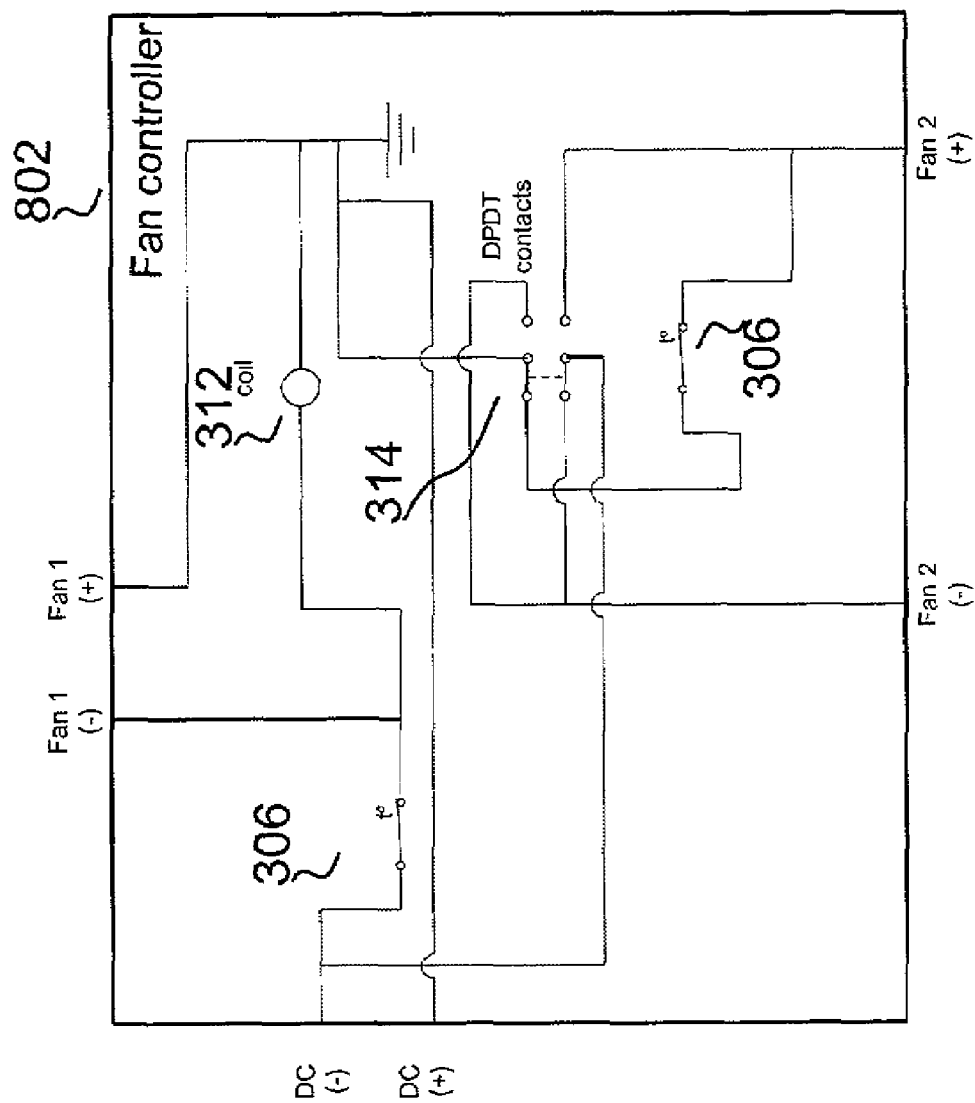
FIG. 8C is a schematic diagram of a fan controller in a third operating condition according to another embodiment of the present invention.

FIGS. 8A, 8B and 8C are schematic diagrams of a fan controller 802 according to another embodiment of the present invention. Fan controller 802 can be placed in a cabinet. Fans and a DC power source can be connected to fan controller 802 as shown by the fan 1 connections, fan 2 connections and DC connections in the FIGS. 8A, 8B and 8C.

FIG. 8A illustrates the operation of fan controller 802 where thermostat 306 is not closed. For example, this operation occurs where the ambient temperature measured by thermostat 306 is below the temperature at which thermostat 306 closes. FIG. 8B illustrates the operation of fan controller 802 where thermostat 306 is closed, but thermostat 310 is open. For example, this operation occurs where the ambient temperature measured by thermostat 306 is above the temperature at which thermostat 306 closes, and where the ambient temperature measured by thermostat 310 is below the temperature at which thermostat 310 closes. FIG. 8C illustrates the operation of fan controller 802 where both thermostat 306 and thermostat 310 are closed. For example, this operation occurs where the ambient temperature measured by thermostat 306 is above the temperature at which thermostat 306 closes, and where the ambient temperature measured by thermostat 310 is above the temperature at which thermostat 310 closes. Each of these operating ranges or conditions has been discussed in more detail above.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for controlling a first fan and a second fan in a heat exchanger, comprising:
    (a) determining an ambient temperature;
    (b) operating the second fan in a reverse direction if the ambient temperature is less than a predetermined first threshold temperature or if the ambient temperature exceeds the first threshold, but falls below a second threshold;
    (c) operating the first fan in a forward direction if the ambient temperature is greater than the predetermined first threshold temperature;
    (d) operating the first fan and the second fan in a forward direction if the ambient temperature is greater than a predetermined third threshold temperature; and
    (e) operating the first fan in the forward direction and shutting off the second fan if the ambient temperature falls below a fourth threshold.

2. The method recited in claim 1, further comprising:
    selecting a first operating temperature range having a lower temperature bound equal to the second threshold temperature and an upper temperature bound equal to the first threshold temperature; and
    selecting a second operating temperature range having a lower temperature bound equal to the fourth threshold temperature and an upper temperature bound equal to the third threshold temperature.

3. The method recited in claim 1, further comprising controlling the direction of operation of the second fan using a relay.

4. The method recited in claim 1, further comprising controlling a double pole double throw switch by operation of the relay to control the direction of operation of the second fan.

* * * * *